(12) United States Patent
Zhang

(10) Patent No.: US 9,443,667 B2
(45) Date of Patent: Sep. 13, 2016

(54) TOUCH-SENSITIVE PUSH-BUTTON AND ELECTRONIC DEVICE USING THE SAME

(71) Applicants: Fu Tai Hua Industry (Shenzhen) Co., Ltd., Shenzhen (CN); HON HAI PRECISION INDUSTRY CO., LTD., New Taipei (TW)

(72) Inventor: Jun-Wei Zhang, Shenzhen (CN)

(73) Assignees: Fu Tai Hua Industry (Shenzhen) Co., Ltd., Shenzhen (CN); HON HAI PRECISION INDUSTRY CO., LTD., New Taipei (TW)

(*) Notice: Subject to any disclaimer, the term of this patent is extended or adjusted under 35 U.S.C. 154(b) by 170 days.

(21) Appl. No.: 14/254,037

(22) Filed: Apr. 16, 2014

(65) Prior Publication Data

US 2015/0001057 A1    Jan. 1, 2015

(30) Foreign Application Priority Data

Jun. 27, 2013 (CN) .......................... 2013 1 0262109

(51) Int. Cl.
| | |
|---|---|
| H01H 13/50 | (2006.01) |
| H01H 3/12 | (2006.01) |
| H01H 13/52 | (2006.01) |
| H03K 17/96 | (2006.01) |
| H01H 3/02 | (2006.01) |

(52) U.S. Cl.
CPC ............... *H01H 3/12* (2013.01); *H01H 13/52* (2013.01); *H03K 17/962* (2013.01); *H01H 2003/0293* (2013.01); *H01H 2239/006* (2013.01); *H03K 2217/96054* (2013.01)

(58) Field of Classification Search
CPC ...................................................... H01H 13/50
USPC ................................................. 200/341, 600
See application file for complete search history.

(56) References Cited

U.S. PATENT DOCUMENTS

| | | | | |
|---|---|---|---|---|
| 6,188,225 B1* | 2/2001 | Tislaric | .............. | G01R 31/3272 324/422 |
| 8,072,230 B1* | 12/2011 | Seguine | .............. | G06K 9/0002 324/663 |
| 2011/0270219 A1* | 11/2011 | Friedli | .............. | A61M 5/14244 604/506 |
| 2013/0141342 A1* | 6/2013 | Bokma | .............. | G06F 3/03547 345/173 |

* cited by examiner

*Primary Examiner* — Edwin A. Leon
*Assistant Examiner* — Iman Malakooti
(74) *Attorney, Agent, or Firm* — Zhigang Ma

(57) ABSTRACT

A touch-sensitive push-button includes a button, a capacitor arranged on a top side of the button, a circuit board arranged on a bottom side of the button, and a switch arranged between the button and circuit board. The switch and the capacitor are electrically coupled to each other in parallel. The switch changes from an electrical OFF state to an electrical ON state when the button is pressed, thereby causing the capacitor to be short-circuited.

4 Claims, 5 Drawing Sheets

TOUCH-SENSITIVE PUSH-BUTTON AND ELECTRONIC DEVICE USING THE SAME

FIELD

The present disclosure relates to buttons, and particularly to a touch-sensitive push-button and an electronic device using the touch-sensitive push-button.

BACKGROUND

Push buttons and touch-sensitive buttons of electronic devices are currently configured only as separate individual components, which increases a cost and complexity of the electronic devices.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the views.

DETAILED DESCRIPTION

Embodiments of the present disclosure will be described with reference to the accompanying drawings. In the following disclosure the term "coupled" is defined as connected, whether directly or indirectly through intervening components, and is not necessarily limited to physical connections. The connection can be such that the objects are permanently connected or releasably connected.

Figure 1:
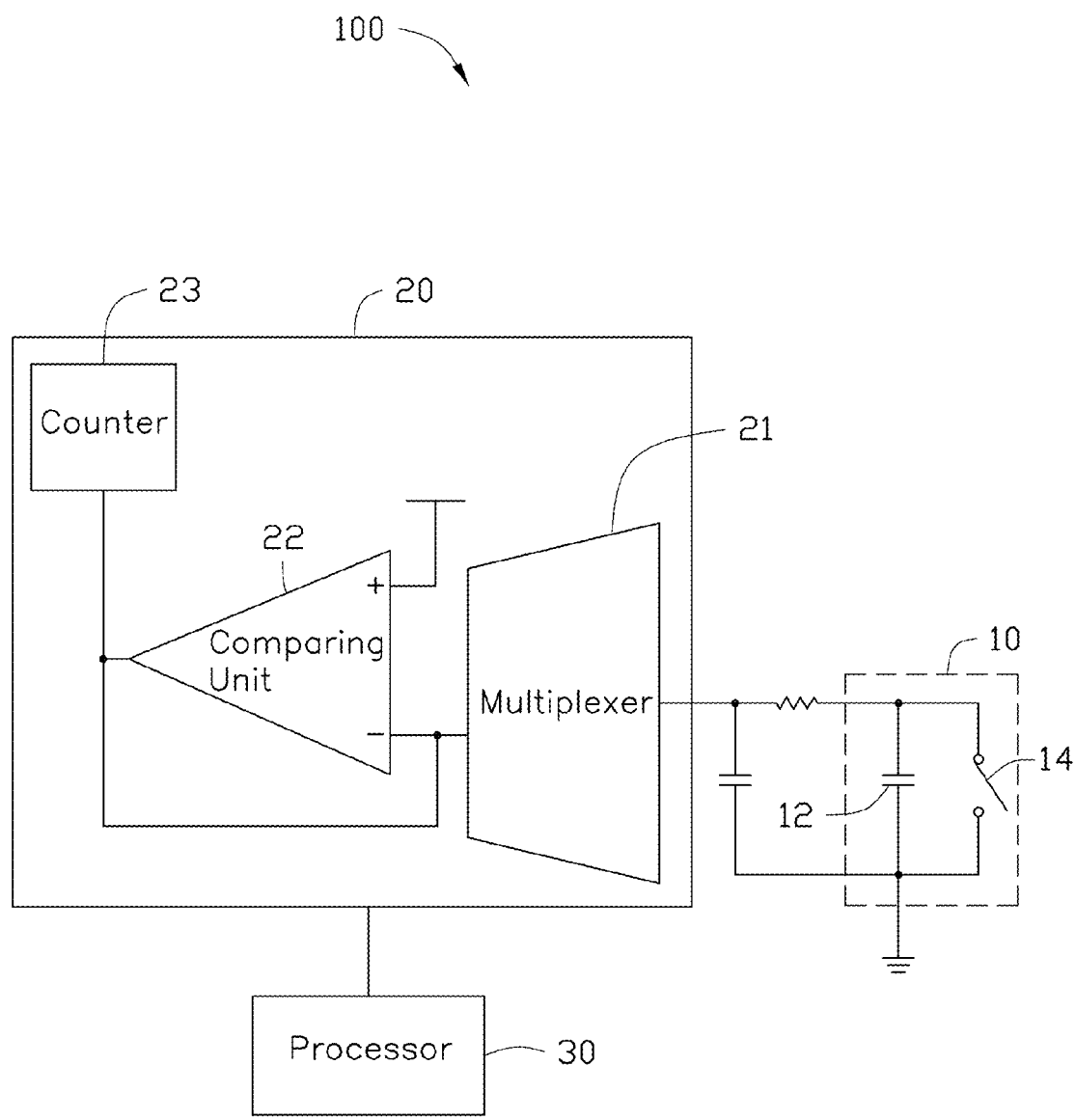
FIG. 1 is a block diagram of an embodiment of an electronic device.
Figure 2:
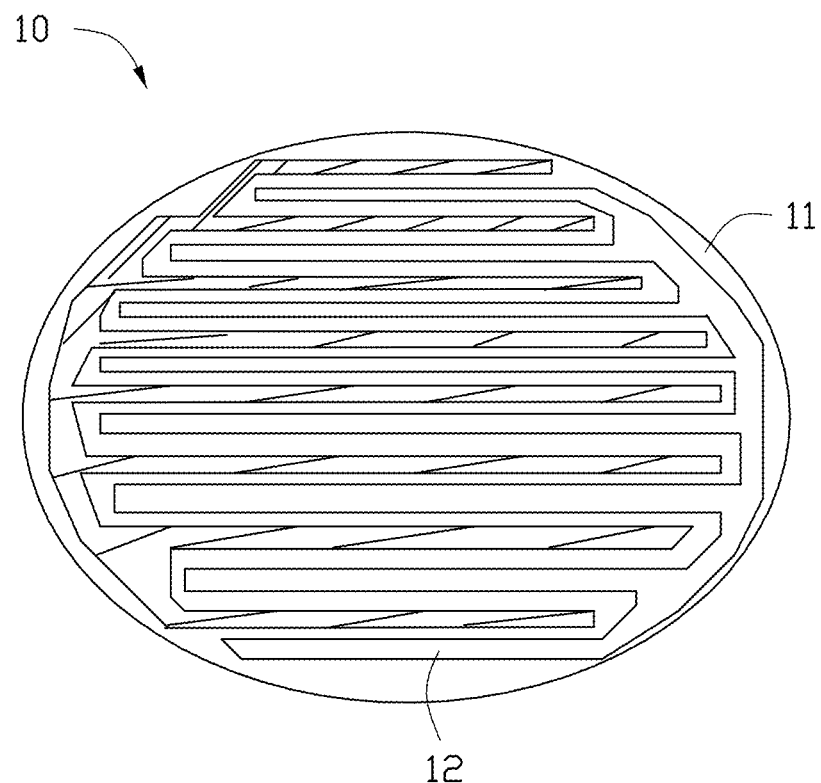
FIG. 2 is a plan view of a top side of a button of a touch-sensitive push-button assembly of the electronic device of FIG. 1.
Figure 3:
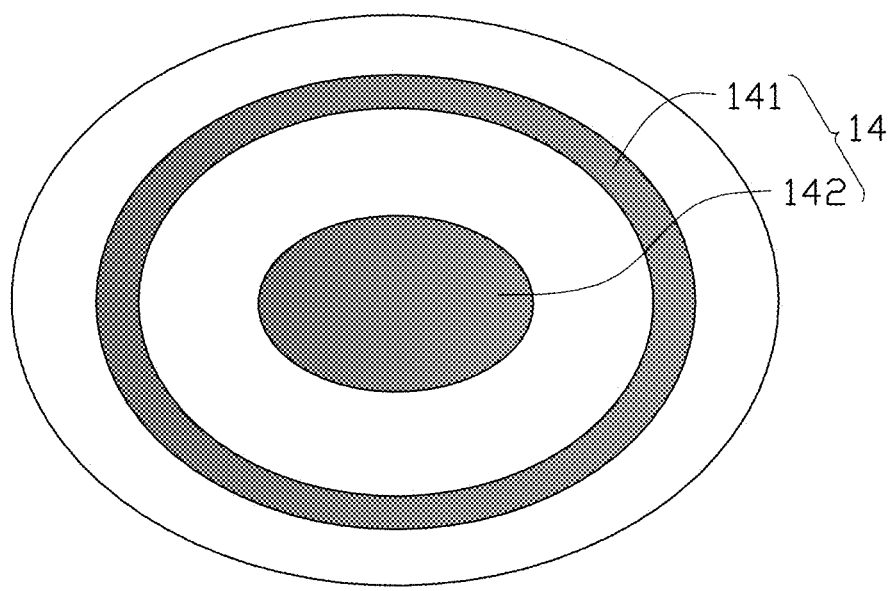
FIG. 3 is a plan view of a bottom side of the button of FIG. 2.
Figure 4:
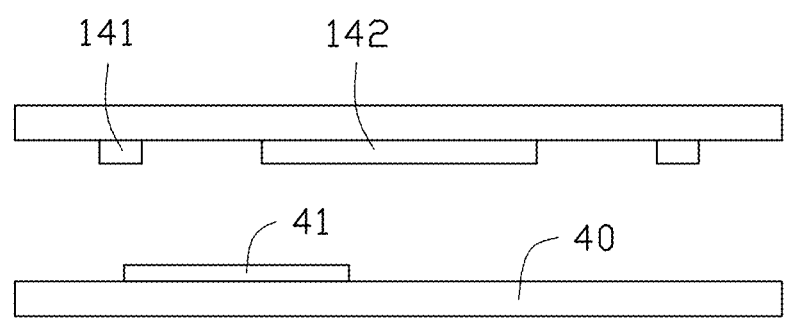
FIG. 4 is a side view of a first embodiment of the button of FIG. 2, a switch, and a circuit board.

Referring to FIGS. 1 and 2, an electronic device 100 can include a touch-sensitive push-button assembly 10, a controller 20, and a processor 30. The touch-sensitive push-button assembly 10 can detect a touch from a user and serve as a mechanical push-button. As a result, the touch-sensitive push-button assembly 10 can be used to input two different kinds of commands, and the processor 30 performs different actions in response to the two different kinds of commands.

The touch-sensitive push-button assembly 10 includes a button 11 and a capacitor 12 arranged on a top side of the button 11. The controller 20 includes a multiplexer 21, a comparing unit 22, and a counter 23. A first end of the capacitor 12 is grounded, and a second end of the capacitor 12 is electrically coupled to one input pin of the multiplexer 21 via a resistor (not labeled). An output pin of the multiplexer 21 is electrically coupled to an inverting input pin of the comparing unit 22. A non-inverting input pin of the comparing unit 22 can output either a high-level or low-level signal set by an automatic level setter. An output pin of the comparing unit 22 is electrically coupled to the counter 23 and the inverting input pin of the comparing unit 22.

The capacitor 12 and the comparing unit 22 constitute an oscillating circuit. The oscillating circuit undergoes a constant periodic charging and discharging cycle when the capacitor 12 is not touched. A frequency of the charging and discharging cycle is detected by the counter 23. When the capacitor 12 is touched by a user's finger, the frequency of the charging and discharging cycle changes. According to the change in frequency of the charging and discharging cycle, the user's touch on the capacitor 12 is determined. The processor 30 executes a first action when the capacitor 12 is touched.

Referring to FIGS. 1, 2, 3 and 4, the button 11 is movably coupled to a housing (not shown) of the electronic device 100. The touch-sensitive push-button assembly 10 can further include a circuit board 40 arranged within the housing of the electronic device 100 and under the button 11, and a switch 14 arranged between the button 11 and the circuit board 40. The switch 14 and the capacitor 12 are electrically coupled to each other in parallel. When the button 11 is pressed, the switch 14 changes from an electrical OFF state to an electrical ON state, thereby causing the capacitor 12 to be short-circuited and turning off the oscillating circuit. A press of the button 11 can then be determined according to the oscillating circuit being turned off. The processor 30 executes a second action when the button 11 is pressed.

In the embodiment, the switch 14 can include a first metal tab 141 and a second metal tab 142 arranged on a bottom side of the button 11, and a third metal tab 41 arranged on the circuit board 40. The first metal tab 141 and the second metal tab 142 are spaced from each other and contact the third metal tab 41 when the button is pressed, thereby changing the switch 14 from the electrical OFF state to the electrical ON state.

Figure 5:
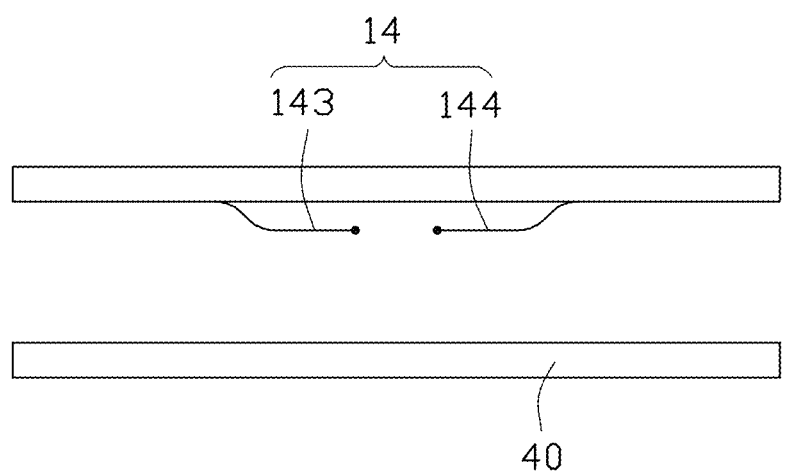
FIG. 5 is a side view of a second embodiment of the button of FIG. 2, a switch, and a circuit board.

Referring to FIGS. 2 and 5, in an alternative embodiment, the switch 14 may include a first elastic metal tab 143 and a second elastic metal tab 144 protruding from the bottom side of the button 11. The first elastic metal tab 143 and the second elastic metal tab 144 are spaced from each other and contact the circuit board 40 directly when the button 11 is pressed. The first elastic metal tab 143 and the second elastic metal tab 144 are elastically deformed upon contacting and resisting the circuit board 40, thereby changing the switch 14 from the electrical OFF state to the electrical ON state.

While various embodiments have been described and illustrated, the disclosure is not to be construed as being limited thereto. Various modifications can be made to the embodiments by those skilled in the art without departing from the true spirit and scope of the present disclosure.

What is claimed is:

1. An electronic device comprising:
   a controller;
   a button;
   a capacitor arranged on a top side of the button;
   a circuit board arranged under the button;
   a switch arranged between the button and circuit board, the switch and the capacitor being electrically coupled to each other in parallel, the switch changing from an electrical OFF state to an electrical ON state when the button is pressed, thereby causing the capacitor to be short-circuited; and
   the controller configured to execute a first action when the capacitor is touched, and to execute a second action when the switch changes from the electrical OFF state to the electrical ON state; wherein
   the capacitor and the controller constitute an oscillating circuit, the oscillating circuit undergoing a constant periodic charging and discharging cycle when the capacitor is not touched, a frequency of the charging and discharging cycle changing if the capacitor is touched, a touch on the button being determined according to the change in frequency of the charging and discharging cycle;

the controller comprises a comparing unit and a counter; the capacitor and the comparing unit constitute the oscillating circuit the frequency of the charging and discharging cycle being detected by the counter; and the controller further comprises a multiplexer, a first end of the capacitor is grounded, and a second end of the capacitor is electrically coupled to one input pin of the multiplexer, an output pin of the multiplexer is electrically coupled to an inverting input pin of the comparing unit, and an output pin of the comparing unit is electrically coupled to the counter and an inverting input pin of the comparing unit.

2. The electronic device according to claim 1, wherein the switch comprises a first elastic metal tab and a second elastic metal tab spaced apart in a non-pressed state, and the first elastic metal tab and the second elastic metal tab are elastically deformed to contact each other when the button is pressed.

3. The electronic device according to claim 1, wherein the switch comprises a first metal tab and a second metal tab arranged on a lower side of the button, and a third metal tab arranged on the circuit board, the first metal tab and the second metal tab are spaced from each other and contact the third metal tab when the button is pressed.

4. The electronic device according to claim 1, wherein the inverting input pin of the comparing unit outputs either a high-level or low-level signal set by an automatic level setter.

* * * * *